(12) United States Patent
Huffenus et al.

(10) Patent No.: US 10,116,271 B2
(45) Date of Patent: Oct. 30, 2018

(54) CURRENT-TO-VOLTAGE CONVERTER, AMPLIFIER INPUT STAGE AND CORRESPONDING AMPLIFIER

(71) Applicant: Devialet, Paris (FR)

(72) Inventors: Alexandre Huffenus, Grenoble (FR); Pierre-Emmanuel Calmel, Le Chesnay (FR); David Aimé Pierre Gras, Echirolles (FR)

(73) Assignee: Devialet, Paris (FR)

( * ) Notice: Subject to any disclaimer, the term of this patent is extended or adjusted under 35 U.S.C. 154(b) by 0 days.

(21) Appl. No.: 15/328,265

(22) PCT Filed: Jul. 23, 2015

(86) PCT No.: PCT/EP2015/066943
§ 371 (c)(1),
(2) Date: Feb. 8, 2017

(87) PCT Pub. No.: WO2016/012569
PCT Pub. Date: Jan. 28, 2016

(65) Prior Publication Data
US 2017/0272040 A1    Sep. 21, 2017

(30) Foreign Application Priority Data

Jul. 23, 2014   (FR) ..................................... 14 57115

(51) Int. Cl.
*H02M 11/00*    (2006.01)
*H03F 3/45*    (2006.01)
*H03F 1/52*    (2006.01)
*H03F 3/16*    (2006.01)

(52) U.S. Cl.
CPC ............... *H03F 1/523* (2013.01); *H03F 3/16* (2013.01)

(58) Field of Classification Search
CPC .................................. H03F 1/523; H03F 3/16
USPC ......................................................... 327/103
See application file for complete search history.

(56) References Cited

U.S. PATENT DOCUMENTS

| 7,132,865 | B1 | 11/2006 | Terrovitis et al. |
| 2005/0035797 | A1 | 2/2005 | Frans et al. |
| 2008/0136492 | A1 | 6/2008 | Hu |

OTHER PUBLICATIONS

PCT/EP2015/066943, International Search Report, dated Nov. 16, 2015, 4 pages.
FR 14-57115, Rapport de Recherche Préliminaire, May 11, 2015, 3 pages.

*Primary Examiner* — Lincoln Donovan
*Assistant Examiner* — Metasebia Retebo
(74) *Attorney, Agent, or Firm* — Soquel Group LLC

(57) ABSTRACT

The current-to-voltage converter includes an input for the current to be converted, an output for the converted voltage, a current-to-voltage conversion resistor arranged between the output and a reference potential, a processing circuit including a transistor, the input being connected to the output via the transistor, a twin circuit including components identical to and disposed in a similar way to those of the processing circuit, a voltage follower connected at the input to the processing circuit and at the output to the twin circuit, and means for reinjecting the current at the output of the follower into the processing circuit.

13 Claims, 3 Drawing Sheets

CURRENT-TO-VOLTAGE CONVERTER, AMPLIFIER INPUT STAGE AND CORRESPONDING AMPLIFIER

CROSS-REFERENCES TO RELATED APPLICATIONS

This application claims priority benefit under 35 U.S.C. § 371 to International Patent Application No. PCT/EP2015/066943 entitled INPUT STAGE OF AN AMPLIFIER AND CORRESPONDING AMPLIFIER, and filed by inventors Alexandre Huffenus, Pierre-Emmanuel Calmel and David Aimé Pierre Gras on Jul. 23, 2015. International Patent Application No. PCT/EP2015/066943 claims priority to French Patent Application No. 14 57115, filed on Jul. 23, 2014.

FIELD OF THE INVENTION

The present invention relates to a current-to-voltage converter, the input current having a variable component, the converter comprising:
an input for the current to be converted;
an output for the converted voltage;
a current-to-voltage conversion resistance connected to the output and to a reference potential, and
a processing circuit comprising:
  a voltage source,
  a main branch comprising at least one transistor whose gate is connected to the voltage source and at least one current source connected in series with the transistor, the input being connected to the output via the transistor.

BACKGROUND OF THE INVENTION

Such a current-to-voltage converter happens to have particular application in a high fidelity amplifier with high linearity.

It is common in such an amplifier, to use at the input, a digital-to-analogue converter such as the component PCM 1792 from the company Texas Instruments. This digital-to-analogue converter has a current output, such that the analogue signal is modulated in intensity.

Insofar as the amplification stage placed downstream uses at the input a modulated voltage, it is necessary to have a current-to-voltage converter between the digital-to-analogue converter and the actual amplifier stage itself.

The current output digital-to-analogue converters are particularly appreciated for the very low harmonic distortion level that they are able to reach. The difficulty consists in exploiting the qualities of such digital-to-analogue converters via a current-to-voltage conversion stage that does not in itself impact the performance of the digital-to-analogue converter.

The current sources contained in such a digital-to-analogue converter are connected to one or more outputs connected to a virtual ground or even connected between a ground and one or more outputs connected to a virtual ground. Such connections are conventionally implemented by means of an operational amplifier mounting arrangement.

A virtual ground is a fixed potential.

In this manner, all the transistors of the digital-to-analogue converter operate at constant current and voltage, therefore in an optimal fashion, regardless of the modulation of the output signal.

In order to preserve this absence of distortion, the current-to-voltage converters placed downstream may also, in a different implementation of this operational amplifier mounting arrangement, comprise specific stages, referred to as "common gate" stage based on MOSFETs (from the English term Metal Oxide Semiconductor Field Effect Transistor) or referred to as "common base" that is based on bipolar transistors. Such common base or common gate-based stages are operated in an open loop.

This type of arrangement comprising of common base or common gate-based transistors, commonly known as "cascode" is described in the document WO 2011/107671.

However, the transistors of such common base or common gate-based stages induce error currents which come to be superposed over the current originating from the digital-to-analogue converter, which is the root cause of the degradation of the starting digital signal.

The error currents are in particular due to the currents absorbed into the gates of the transistors of the common base or common gate-based stages.

In order to overcome this problem, the document WO 2011/107671 describes a current-to-voltage converter having the current reinjection means for reinjecting the current absorbed in the gates of transistors of common base or common gate-based stages.

However, such a current-to-voltage converter is unable, when it is fabricated in the form of an integrated circuit and not by means of discrete components, to compensate for the current absorbed in the substrate on which is formed the current-to-voltage converter.

The current absorbed in the substrate is in fact particularly difficult to measure due to the fact that no reference potential is defined at the level of this substrate.

Moreover, when the current-to-voltage converter is fabricated in the form of an integrated circuit, it comprises ESD (abbreviation for "Electrostatic Discharge") protections, which are capable of protecting the components of the integrated circuit from possible electrostatic discharges.

However, such ESD protection elements are also responsible for an absorption of the current originating from the digital-to-analogue converter which come to be superposed over the previous losses.

SUMMARY

An object of the invention is to provide a solution in order to control the current losses in the substrate of a current-to-voltage converter.

To this end, the object of the invention relates to a current-to-voltage converter of the abovementioned type, comprising:
a twin circuit comprising identical components and arranged in a manner that is similar to those of the processing circuit, the twin circuit comprising:
  a voltage source;
  a twin branch;
a voltage follower that is connected at the input to the main branch of the processing circuit and connected at the output to the twin branch of the twin circuit; and
current reinjection means for reinjecting the current at the output of the follower into the main branch of the processing circuit.

According to some particular embodiments, the current-to-voltage converter comprises one or more of the following characteristic features:

the reinjection means comprise measurement means for measuring the current at the output of the voltage follower, the said current measuring means comprising a current mirror circuit;

the current mirror circuit comprises a first transistor serving to ensure the conveying of a current to the twin circuit and a second transistor serving to ensure the reinjection of a current into the main branch of the processing circuit;

the output of the current reinjection means for reinjecting the current at the output of the follower is connected to a node of the main branch of the processing circuit whose potential is fixed;

the transistor of the processing circuit comprises an ESD protection element, the twin circuit comprising an ESD protection element that is equivalent to the ESD protection element of the transistor;

the voltage follower comprises an operational transconductance amplifier;

the voltage follower comprises a first output for conveying a current to the twin circuit and a second output for reinjecting a current, equal to the current originating from the first output, into the main branch of the processing circuit;

the voltage follower comprises a single transistor;

the voltage follower is formed by a first transistor and a second transistor having a polarity opposite to that of the first transistor, the second transistor being capable of compensating for the voltage drops between the source and the gate of the first transistor;

each transistor forms a cascode stage, imposing a fixed voltage across the terminals of the current sources to which they are connected;

the current-to-voltage converter is fabricated on an integrated circuit;

the transistors of the processing circuit and of the twin circuit are fabricated on the same semiconductor substrate.

The object of the invention also relates to an input stage of a high fidelity amplifier with high linearity and low degree of distortion that comprises a digital to analogue converter at the current output and a current-to-voltage converter of the abovementioned type.

The object of the invention also relates to a high fidelity amplifier with high linearity and low degree of distortion that comprises an input stage of the aforementioned type, and an amplifier stage, that is connected in series with the input stage.

BRIEF DESCRIPTION OF THE DRAWINGS

The invention will be better understood upon reading the description which follows, that is given purely by way of an example only and with reference being made to the drawings in which.

DETAILED DESCRIPTION

Figure 1:
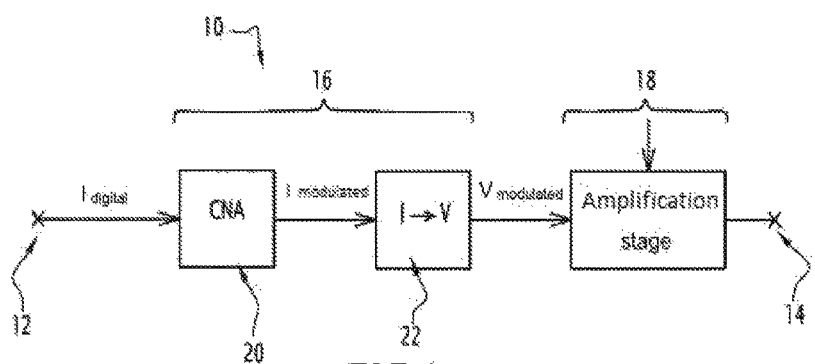
FIG. 1 is a schematic view of a high fidelity amplifier according to the invention.

The amplifier 10, shown schematically in FIG. 1, is a high fidelity amplifier that is capable of receiving over an input 12 a digital signal and capable of generating at the output 14 an amplified analogue signal.

As is known per se, the amplifier 10 comprises an input stage 16 which ensures the conversion of the digital input signal into an analogue output signal that is voltage modulated, as well as an amplification stage 18, that serves to ensure the supply of sufficient power for the load placed downstream, that is to say, one or more speakers. This involves preferably a class A amplifier stage.

The input stage 16 comprises a digital-to-analogue converter 20 whose input is connected to the input 12 of the amplifier for receiving a digital signal $I_{digital}$. This digital-to-analogue converter is capable of supplying at the output an analogue signal that is current modulated $I_{modulated}$. The digital-to-analogue converter is, for example, a PCM 1792 from the company Texas Instruments.

The current $I_{modulated}$ comprises a variable component and may comprise a fixed component.

The output of the digital-to-analogue converter 20 is connected to a current-to-voltage converter 22 according to the invention.

This current-to-voltage converter 22 is capable of supplying a modulated voltage $V_{modulated}$ with a voltage gain, from the modulated current $I_{modulated}$ generated by the digital-to-analogue converter 20.

The output of the current-to-voltage converter 22 is connected to the input of the amplification stage 18, as is known per se.

Figure 2:
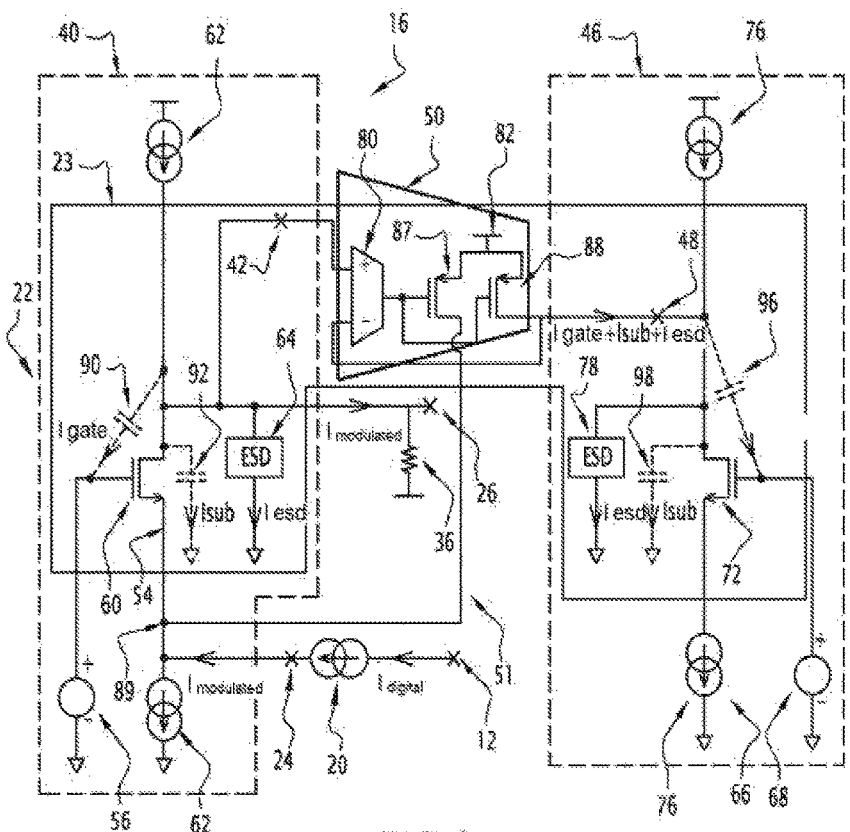
FIG. 2 is an electrical circuit diagram of one input stage of the amplifier shown in FIG. 1 according to a first embodiment.

Illustrated in FIG. 2 is a portion of the input stage 16 corresponding to a first embodiment of the current-to-voltage converter 22.

In this FIG. 2, the digital-to-analogue converter 20 is shown schematically by a current source.

The current-to-voltage converter 22 is fabricated on an integrated circuit, for example, of such type as ASIC (acronym for Application-Specific Integrated Circuit) comprising a semiconductor substrate 23. The substrate 23 is, for example, a silicon-based semiconductor substrate.

The current-to-voltage converter 22 has an input 24 connected to the output of the digital-to-analogue converter 20 and a voltage output 26 that is capable of be directly connected to the amplifier stage 18.

The current-to-voltage converter 22 comprises a conversion resistance 36 whereof one terminal is connected to the output 26, and whereof the other terminal is connected to a reference potential.

The resistance 36 is capable of converting the current $I_{modulated}$ at the output of the digital-to-analogue converter 20 into a voltage $V_{modulated}$.

The current-to-voltage converter 22 comprises, in addition, a processing circuit 40 capable of conveying the current $I_{modulated}$ from the input 24 to the resistance 36. Such a processing circuit 40 comprises a node 42 whose potential is identical to the potential of the output 26.

The current-to-voltage converter 22 also comprises a twin circuit 46 which comprises a node 48 with exactly the same non-linear components connected on this node 48 as the non-linear components of the processing circuit 40 connected on to the node 42 of the processing circuit 40.

A non-linear component is a component such as an electric dipole, that has an electrical voltage and through which an electric current passes in a manner such that the voltage and the current of this component are not linked by a linear differential equation with constant coefficients.

The current-to-voltage converter 22 comprises, in addition, a voltage follower 50 that imposes a potential at the node 42 of the processing circuit 40 that is identical to the potential of the node 48 of the twin circuit 46. The node 42 is, in fact, connected to an input of the follower 50 and the node 48 is connected to an output of the follower 50. Thus, the processing circuit 40 and the twin circuit 46 are connected to each other by means of the follower 50.

The voltage follower 50 is fabricated on the semiconductor substrate 23.

The voltage follower 50 comprises, in this first embodiment, an operational transconductance amplifier. Such an operational transconductance amplifier is capable of supplying an output current proportional to the voltage applied at the input.

The current-to-voltage converter 22 also comprises the reinjection means 51 that are capable of reinjecting the current at the output of the voltage follower 50 into the processing circuit 40.

The processing circuit 40 is capable of cancelling out the direct current component of the current $I_{modulated}$ originating from the digital-to-analogue converter 20 when the input current comprises a direct current component.

The processing circuit 40 comprises a main branch 54 and a voltage source 56, the voltage source 56 being connected by one of its ends to a fixed potential.

The main branch 54 comprises a transistor 60 fabricated on the semiconductor substrate 23 of the current-to-voltage converter 22. The gate of this transistor 60 is connected to the voltage source 56.

The input 24 is connected to the output 26 through the source and the drain of the transistor 60 of the processing circuit 40.

The transistor 60 is, for example, a MOSFET.

The main branch 54 comprises, in addition, at least one current source 62 connected in series with the transistor 60 and a reference potential.

In the first embodiment illustrated in FIG. 2, the main arm 54 comprises two current sources 62, one being connected to the drain of the transistor 60 of the processing circuit 40 and the other to the source of this transistor 60.

The transistor 60 forms a first cascode stage or common base or common gate-based stage of the input stage 16.

Such a cascode stage imposes a constant potential at the input 24, regardless of the voltage at the level of the output 26.

In addition, such a cascode stage provides the ability to ensure that the current sources 62 present no voltage variation at their terminals when the voltage at the level of the output 26 varies, with this being so even when this voltage varies by several dozens of volts.

The processing circuit 40 also comprises other cascode stages and thus other transistors 60, that are not visible in FIG. 2, as well as voltage and current sources that are associated therewith.

The processing circuit 40 is further provided with an ESD protection element 64 disposed between the substrate 23 and the output 26. The ESD protection element 64 is, for example, formed of diodes connected to reference potentials.

In FIG. 2, only the transistor 60 and the ESD protection element 64 of the processing circuit 40 are shown fabricated onto the substrate 23. However, it is quite possible to envisage integrating other elements of the processing circuit 40 on the substrate 23, such as current sources 62 and the voltage source 56.

The twin circuit 46 comprises nonlinear components that are identical to those of the processing circuit 40 such that the non-linear components of the twin circuit 46 are arranged on the same given substrate 23 as the non-linear components of the processing circuit 40.

In particular, the twin circuit 46 comprises transistors that are identical to the transistors 60 of the processing circuit 40 and disposed on the same given substrate 23. In similar fashion, the twin circuit 46 comprises an ESD protection element that are identical to the ESD protection element 64 of the processing circuit 40 and arranged on the same given substrate 23.

The twin circuit 46 thus comprises a twin branch 66 that is identical to the main branch 54 of the processing circuit 40 and a voltage source 68 that is identical to the voltage source 56. In addition, the voltage source 68 is connected by one of its ends to a fixed potential.

The twin branch 66 comprises a transistor 72 fabricated on the same semiconductor substrate 23 as the transistor 60 of the main branch 54 of the processing circuit 40. The gate of this transistor 72 is connected to the voltage source 68.

The twin branch 66 comprises, in addition, two current sources 76 connected in series with transistor 72 between two reference potentials.

The twin circuit 46 is, in addition, provided with an ESD protection element 78 that is identical to that of the transistor 60 and fabricated on the same semiconductor substrate 23 as the ESD protection element 64 of the processing circuit 40.

In FIG. 2, only the transistor 72 and the ESD protection element 78 of the twin circuit 46 are represented as being fabricated on the substrate 23. However, it is quite possible to envisage integrating other elements of the twin circuit 46 on the substrate 23, such as current sources 76 and the voltage source 68.

The voltage follower 50 comprises, as shown in FIG. 2, two voltage inputs and two current outputs. As previously indicated above, the voltage follower 50 shown in FIG. 2 is an operational transconductance amplifier.

The voltage follower 50 comprises a first stage 80 serving to ensure the differential input stage function. This first stage 80 is in this first embodiment a transconductance stage. With respect to a system for receiving an input voltage and supplying an output current, the term "transconductance" is understood to refer to the ratio between the variation of the output current and the variation of the input voltage.

The voltage follower 50 comprises, in addition, a second stage 82 that ensures, on the one hand, the conveying of the current from a first output of the follower 50 to the node 48 of the twin circuit 46 and constituting, on the other hand, the re-injection means 51 from a second output of the follower 50.

The first stage 80 of the voltage follower 50 comprises two voltage inputs, one positive and one negative. The positive input of the first stage 80 is connected to the node 42 of the processing circuit 40 and the negative input of the first stage 80 is connected to the node 48 of the twin circuit 46. The negative input of the first stage 80 thus forms a feedback loop that servo controls the output voltage of the follower 50 on the value of the input voltage of the follower 50.

The first stage 80 of the voltage follower 50 comprises an output connected to the second stage 82 of the voltage follower 50.

The second component 82 of the voltage follower 50 comprises two identical transistors 87, 88 that are connected in the voltage follower 50 at the level of their gate to the output of the first component 80, and connected to each other at the level of their source.

The first transistor 87 is configured so as to reinject a current that is identical to the current that passes through the second transistor 88, towards a node of the main branch 54 of the processing circuit 40, for example the node 89. The drain of the first transistor 87 is thus connected to the node 89 or to any other node of the main branch 40.

The potential of the reinjection node, such as the node 89, is fixed.

The second transistor 88, that is identical to the first transistor 87, is configured so as to convey the output current from the operational transconductance amplifier 50 to the node 48 of the twin circuit 46. The drain of the second transistor 88 is thus connected to the node 48 of the twin circuit.

The two transistors 87, 88 are thus configured in order to supply the same current, at the output of the follower, on the one hand, to the node 89 or any other node of the branch 54 for the first transistor 87 and, on the other hand, to the twin circuit 46 for the second transistor 88. Thus, the voltage follower 50 has available two current outputs.

The transistors 60 and 72 are responsible for causing the dissipation of the current that passes therethrough. The current absorbing elements that absorb the current from the transistors 60 and 72 are modeled by the capacitors, that are visible shown in broken lines in FIG. 2. Thus, the capacitor 90 and the capacitor 92 respectively model the current absorbing elements that absorb the current in the gate and the substrate of the transistor 60. Similarly, the capacitor 96 and the capacitor 98 respectively model the current absorbing elements that absorb the current in the gate and the substrate of the transistor 72. The currents absorbed in the gates of the transistors 60, 72 are denoted $I_{gate}$ and the currents absorbed in the substrates of these transistors 60, 72 are denoted $I_{sub}$.

The ESD protection elements 64, 78 of the transistors are also responsible for causing the dissipation of the current that passes therethrough. The currents absorbed in the ESD protection elements 64, 78 are denoted $I_{esd}$.

It is understood that during the conveying of the current $I_{modulated}$ from the input 24 to the resistance 36, the capacitors 90 and 92 of the transistor 60 as well as the ESD protection element 64 of the processing circuit 40 absorb a part of the current $I_{modulated}$. The total current absorbed is thus the sum of the current absorbed by the gate of the transistor 60 $I_{gate}$, the substrate of the transistor 60 $I_{sub}$ and the ESD protection element 64 of the transistor $I_{esd}$ 60.

The twin circuit 46 being identical to the processing circuit 40 and fabricated on the same given semiconductor substrate 23 and the two circuits being connected by the voltage follower 50, necessarily the total current absorbed in the capacitors 96 and 98 of the transistor 72 and the ESD protection element 78 of the twin circuit 46 is equal to the total current absorbed in the capacitors 90 and 92 and the ESD protection element 64 of the transistor 60. In addition, this total current absorbed is equal to the current at the output of the voltage follower 50.

It may be conceived thus that a current equal to the current absorbed by the transistor 60 is reinjected at the level of the node 89 or any other node of the main branch 54 of the processing circuit 40, thus compensating for the current necessary for the charging and discharging of the capacitors 90 and 92 of the transistor 60 and the current absorbed in the ESD protection element 64.

Thus, the processing circuit 40 cancels out the direct current component of the current $I_{modulated}$ at the output of the digital-to-analogue converter when such a direct current component is present and the resistance 36 converts the variable component of the current $I_{modulated}$ into voltage. The twin circuit 46, the voltage follower 50 and the reinjection means 51 are capable of compensating for the current losses induced by the non-linear components of the processing circuit 40, in particular the transistor 60 and the ESD protection element 64.

Thus, the circuit presented in this first embodiment makes it possible to maintain a very low harmonic distortion due to the presence of cascode stages while also overcoming the drawbacks associated with the use of such cascode stages. In particular, the quality of the information contained in the current $I_{modulated}$ originating from the digital-to-analogue converter 22 is maintained when this current $I_{modulated}$ is converted into a voltage by the resistance 36.

In addition, the current-to-voltage converter of the invention may be used both with discrete components as well as in an integrated circuit, such as an ASIC. In particular, the drawbacks associated with the presence of a parasitic current absorbed in the substrate of the integrated circuit or in the ESD protection elements are compensated for by the reinjection means proposed in the invention.

Thus, the distortion gain is in the order of 15 to 20 dB.

Figure 3:
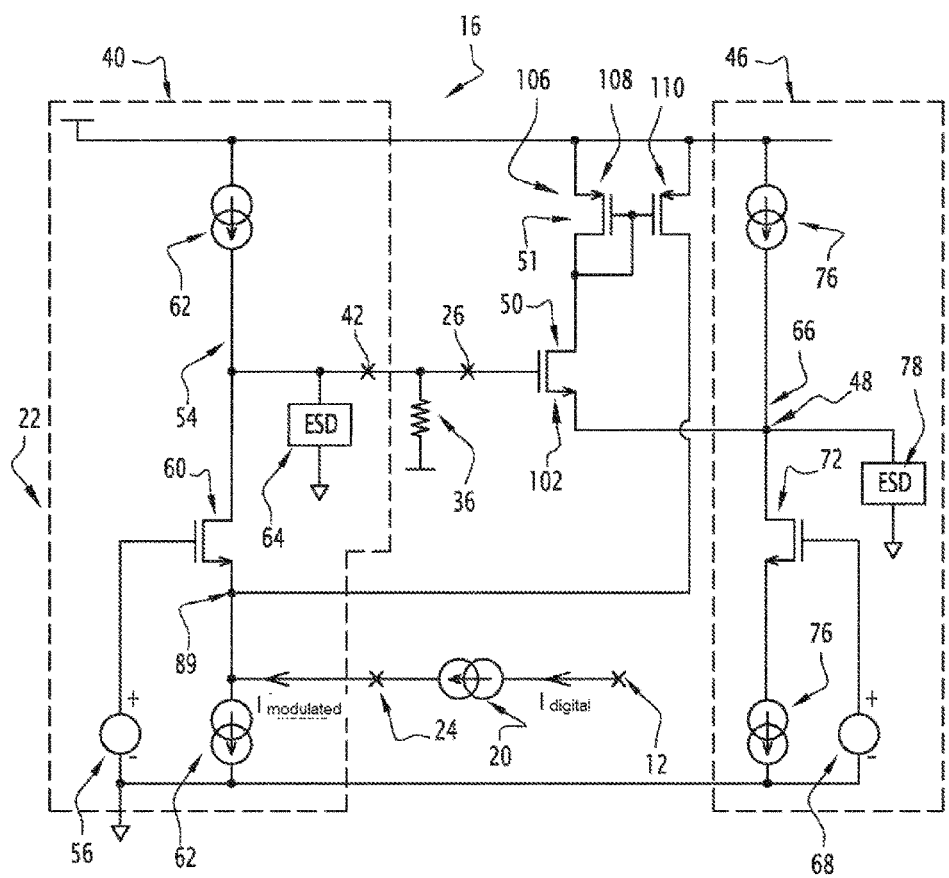
FIG. 3 is an electrical circuit diagram of one input stage of the amplifier shown in FIG. 1 according to a second embodiment.

FIG. 3 illustrates a second embodiment of the invention for which the elements that are identical to the first embodiment, previously described above, are identified by the same reference numerals, and thus are not described again. Only the differences have been highlighted.

In this FIG. 3 only a portion of the input stage 16 is shown.

In this second embodiment, the voltage follower 50 is formed of a single transistor 102, for example a MOSFET type transistor. The gate of this transistor 102 is connected to the processing circuit 40, for example, at the level of its node 42, and its source is connected to the twin circuit 46, for example, at the level of its node 48. The drain of this transistor 102 is connected to the reinjection means 51.

The reinjection means 51 of the current at the output of the follower 50 are formed of a current mirror circuit 106 that is capable in particular of measuring and of reinjecting the output current of the follower 50 into the main branch 54 of the processing circuit 40.

Such a current mirror circuit 106 comprises two transistors 108 and 110 connected to each other by means of the gate and the source thereof. In addition, the gates of these transistors 108 and 110 are also connected to the drain of the voltage follower 50 and the sources of these transistors 108, 110 are connected to a reference potential.

The drain and the gate of the transistor 108 are connected to the voltage follower 50, and thereby to the twin circuit 46. Such a transistor 108 thus serves to ensure the conveying of the current originating from the voltage follower 50 to the twin circuit 46.

The drain 110 of the transistor is connected to the main branch 54 of the processing circuit 40, for example at the level of the node 89. Such a transistor 110 serves to ensure, thus, the reinjection into the processing circuit 40 of the currents absorbed by the various non-linear components of the processing circuit 40.

The transistors 108 and 110 that form the current mirror circuit are, for example, MOSFET transistors.

It is conceivable that in this second embodiment, a current having a value equal to the current absorbed by the transistor 60 is reinjected back into the main branch 54 of the processing circuit 40, thus compensating for the current absorbed by the non-linear components of the processing circuit 40.

The current mirror circuit 106 thus makes it possible to obtain a reinjection of the current absorbed by the transistor 60 without using the operational amplifier circuit.

Figure 4:
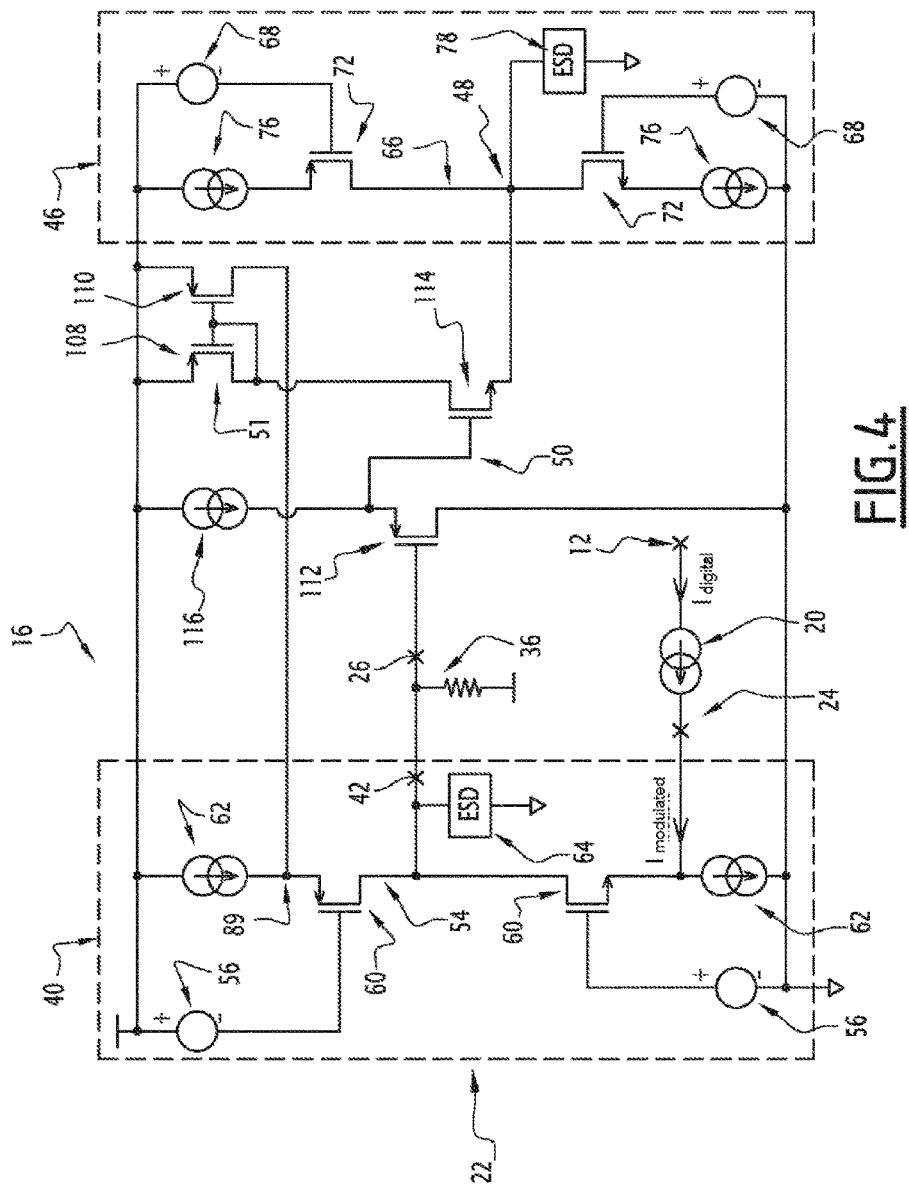
FIG. 4 is an electrical circuit diagram of one input stage of the amplifier shown in FIG. 1 according to a third embodiment.

FIG. 4 illustrates a third embodiment of the invention for which the elements that are identical to the second embodiment, previously described above, are identified by the same reference numerals and are thus not described again. Only the differences have been highlighted.

In this third embodiment, the processing circuit 40 comprises two transistors 60 and two voltage sources 56.

Each transistor 60 is connected by its gate to one of the voltage source 56 and by its source to one of the current sources 62. In addition, the two transistors 60 are connected to each other and to the output 26 at the level of the drain thereof. These two transistors 60 each form a cascode stage or common gate stage.

The twin circuit 46 comprises, similarly to the processing circuit 40, two transistors 72 and two voltage sources 68. The transistors 72 are arranged on the same given semiconductor substrate 23 (not represented in FIG. 4) as the transistors 60 of the processing circuit 40.

Each transistor 72 is connected by its gate to one of the voltage sources 68 and by its source to one of the current sources 76. In addition, the two transistors 72 are connected to each other at the level of the drain thereof. These two transistors 72 each form a cascode stage or common gate stage.

In this third embodiment, the voltage follower 50 comprises two transistors 112 and 114 as well as a current source 116.

The gate of the first transistor 112 is connected to the processing circuit 40, for example at the level of the node 42, and its source is connected to the current source 116, as well as to the gate of the second transistor 114. The drain of the first transistor 112 is connected to a reference potential.

The second transistor 114 of the voltage follower 50 is connected at the level of its source to the twin circuit 46, for example at the level of the node 48, and at the level of its drain to the current mirror circuit 106.

The second transistor 114 is of opposite polarity relative to the first transistor 112.

The transistors 112 and 114 of the voltage follower are, for example, MOSFET transistors.

The current source 116 of the voltage follower 50 is connected at one of its ends to a reference potential, with the other end being connected to the first transistor 112 of the voltage follower 50.

Thus, in this third embodiment, the cascode stages are duplicated in a manner so as to ensure the absence of harmonic distortion. The cascode stage at the "bottom" of FIG. 4, formed by the transistor 60 connected to the digital-to-analogue converter 20, makes it possible to isolate the current sources 62 and 20 from all variations in potential on the node 24 even in the event of variation of the potential on the node 42, and thus to ensure optimal operation of the current sources 62, 20. It is similarly the case for the cascode stage at the "top", formed by the transistor 60 that is not directly connected to the digital-to-analogue converter 20, which thereby makes it possible to isolate the current source 62 from a variation in potential on the node 89 even if there is a variation in the potential on the node 42.

In addition, the combination of two transistors 112, 114 in order to form the voltage follower 50 provides the ability to increase the quality of the follower 50 as compared to a mounting arrangement with a single transistor.

Indeed, the follower 50 of the second embodiment comprising a single transistor is not ideal insofar as it brings about a drop in the voltage at the level of its source as compared to the voltage at the level of its gate. The addition of a second transistor 114 having the opposite polarity relative to the voltage follower 50 makes it possible then to induce an increase in the voltage at the level of the source of this second transistor as compared to the voltage at the level of its gate by a value that is identical to the value of the drop in voltage of the first transistor. It is understood thus that the voltages of the two transistors are compensated for in a manner such that the output voltage of the voltage follower 50 is identical to its input voltage.

Thus, the input stage 16 according to the invention allows, particularly in the three embodiments previously described above, to control the current losses in the substrate of a current-to-voltage converter.

According to a fourth embodiment of the invention, not represented in the figures, the voltage follower 50 comprises a single output connected to the twin circuit 46. The voltage follower 50 is an amplifier having unit voltage gain.

The power supply of the voltage follower 50 is connected to a current mirror circuit. Such a current mirror circuit is capable of measuring the power supply current of the follower 50 and of reinjecting it into the processing circuit 40.

Thus, in this fourth embodiment, the voltage follower function is provided for by an amplifier having unit voltage gain. The function of measurement and reinjection of the current at the output of the follower 50 in the processing circuit 40 is ensured by the current mirror circuit placed on the power supply circuit of the follower 50. In effect, the current consumed by the follower 50 is equal to the current supplied at the output of the follower 50.

The invention claimed is:

1. A current-to-voltage converter, the input current having a variable component, the converter comprising:
   an input for the current to be converted;
   an output for the converted voltage;
   a current-to-voltage conversion resistance connected to the output and to a reference potential;
   a processing circuit comprising:
      a voltage source;
      a main branch comprising at least one transistor whose gate is connected to the voltage source and at least one current source connected in series with the transistor, the input being connected to the output via the transistor;
   a twin circuit comprising:
      a voltage source that is identical to the voltage source of the processing circuit;
      a twin branch that is identical to the main branch of the processing circuit;
   a voltage follower that is connected at the input to the main branch of the processing circuit and connected at the output to the twin branch of the twin circuit, and
   current reinjection means for reinjecting the current at the output of the follower into the main branch of the processing circuit, wherein the voltage follower comprises a first output for conveying a current to the twin circuit and a second output for reinjecting a current, equal to the current originating from the first output, into the main branch of the processing circuit, the converter being fabricated on a substrate.

2. A converter according to claim 1, wherein the reinjection means comprise measurement means for measuring the current at the output of the voltage follower, said current measuring means comprising a current mirror circuit.

3. A converter according to claim 2, wherein the current mirror circuit comprises a first transistor serving to ensure the conveying of a current to the twin circuit and a second transistor serving to ensure the reinjection of a current into the main branch of the processing circuit.

4. A converter according to claim 1, wherein the output of the current reinjection means for reinjecting the current at the output of the follower is connected to a node of the main branch of the processing circuit whose potential is fixed.

5. A converter according to claim 1, wherein the transistor of the processing circuit comprises an ESD protection element, the twin circuit comprising an ESD protection element that is identical to the ESD protection element of the transistor.

6. A converter according to claim 1, wherein the voltage follower comprises an operational transconductance amplifier.

7. A converter according to claim 1, wherein the voltage follower comprises a single transistor.

8. A converter according to claim 1, wherein the voltage follower is formed by a first transistor and a second transistor having a polarity opposite to that of the first transistor, the second transistor being capable of compensating for voltage drops between the source and the gate of the first transistor.

9. A converter according to claim 1, wherein each transistor forms a cascode stage, imposing a fixed voltage across the terminals of the current sources to which they are connected.

10. A converter according to claim 1, wherein it is fabricated on an integrated circuit.

11. A converter according to claim 1, wherein the transistors of the processing circuit and of the twin circuit are fabricated on the same semiconductor substrate.

12. An input stage of an amplifier comprising a digital-to-analogue converter at the current output and a current-to-voltage converter according to claim 1.

13. An amplifier comprising an input stage according to claim 12, and an amplification stage connected in series to the input stage.

* * * * *